United States Patent [19]

Stahlhofen

[11] Patent Number: 4,628,020
[45] Date of Patent: Dec. 9, 1986

[54] LIGHT-SENSITIVE COMPOUND MIXTURE AND COPYING MATERIAL COMPRISING O-NAPHTHQUINONEDIAZIDE COMPOUND

[75] Inventor: Paul Stahlhofen, Wiesbaden, Fed. Rep. of Germany

[73] Assignee: Hoechst Aktiengesellschaft, Frankfurt am Main, Fed. Rep. of Germany

[21] Appl. No.: 338,640

[22] Filed: Jan. 11, 1982

[30] Foreign Application Priority Data

Jan. 14, 1981 [DE] Fed. Rep. of Germany ....... 3100856

[51] Int. Cl.$^4$ .......................... G03C 1/54; G03C 1/94; C07C 113/00
[52] U.S. Cl. .................................. 430/165; 430/192; 430/193; 430/302; 430/326; 534/557
[58] Field of Search ............... 430/193, 192, 165, 326, 430/302; 260/141 D; 534/557

[56] References Cited

U.S. PATENT DOCUMENTS

| | | | |
|---|---|---|---|
| 3,046,118 | 7/1962 | Schmidt | 430/193 |
| 3,647,443 | 3/1972 | Rauner et al. | 430/190 |
| 3,785,825 | 1/1974 | Deutsch et al. | 430/193 |
| 3,802,885 | 4/1974 | Lawson et al. | |
| 4,005,437 | 1/1977 | Ross et al. | 430/193 |
| 4,197,128 | 4/1980 | Watanabe et al. | 430/193 |
| 4,266,001 | 5/1981 | Buhr et al. | |

FOREIGN PATENT DOCUMENTS 739654 3/1954 United Kingdom .

*Primary Examiner*—Charles L. Bowers, Jr.
*Attorney, Agent, or Firm*—Schwartz, Jeffery, Schwaab, Mack, Blumenthal & Evans

[57] ABSTRACT

A light-sensitive mixture comprising a light-sensitive naphthoquinone-diazide-sulfonic acid ester corresponding to the formula:

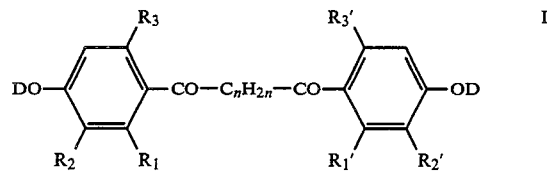

wherein D represents a 1,2-naphthoquinone-2-diazide-5-sulfonyl or -4-sulfonyl radical; $R_1$, $R_2$, $R_3$, $R_1'$, $R_2'$ and $R_3'$ each represent hydrogen, halogen, alkyl groups having 1 to 4 carbon atoms or radicals of the formula DO and n represents an integer from 2 to 18; not more than three DO radicals in total being present on one benzene ring. The mixture is useful for preparing printing plates or photoresists.

10 Claims, No Drawings

LIGHT-SENSITIVE COMPOUND MIXTURE AND COPYING MATERIAL COMPRISING O-NAPHTHQUINONEDIAZIDE COMPOUND

BACKGROUND OF THE INVENTION

The present invention relates to a positive-action, light-sensitive mixture which comprises a light-sensitive 1,2-naphthoquinone-2-diazide-sulfonic acid ester of a polyhydric phenol containing keto groups and which is particularly suitable for preparing planographic printing plates.

Light-sensitive compounds of this general type are disclosed in German Pat. No. 938,223 and U.S. Pat. No. 3,802,885. These are di- or tri- hydroxybenzophenones which are partially or completely esterified with naphthoquinone-diazide-sulfonic acids. Recently, the art has shown a preference amongst these compounds for the completely esterified representatives which contain no free phenolic hydroxyl groups. Such compounds exhibit relatively high light-sensitivity and give long print runs, but they have the disadvantage that their solubility in the organic solvents customarily used for coating printing plates, such as partial ethers of glycols or alkyl esters of carboxylic acids such as butyl acetate, is too low for some purposes. Moreover, in combination with the preferred binders, such as novolacs, which are insoluble in water and soluble in aqueous-alkaline solvents, they give layers which in the unexposed state are not sufficiently resistant to the usual alkaline developer solutions. These layers are also attacked to a certain extent during printing in offset printing presses, when fountain solutions containing alcohol are used.

German Offenlegungsschrift No. 2,828,037 discloses mixtures which contain naphathoquinone-diazide-sulfonic acid esters of certain bisphenol derivatives in which two benzene rings are joined by an aliphatically substituted methylene bridge. These compounds have a high solubility in organic solvents. However, they do not have optimum resistance to alkaline developer solutions and to fountain solutions containing alcohol.

SUMMARY OF THE INVENTION

Accordingly, it is the object of the invention to provide an improved light-sensitive, positive-action mixture comprising a naphthoquinone-diazide-sulfonate ester.

Another object of the present invention is to provide a light-sensitive mixture which exhibits a high light-sensitivity.

It is also an object of the present invention to provide a light-sensitive mixture which can be used to produce printing plates which give long printing runs.

An additional object of the present invention is to provide a light-sensitive mixture which exhibits good solubility in the customary organic solvents.

A further object of the present invention is to provide a light-sensitive mixture which exhibits a good resistance to alkaline developer solutions.

Yet another object of the present invention is to provide a light-sensitive mixture which exhibits satisfactory resistance to alcohol-containing fountain solutions used in offset printing.

A still further object of the present invention is to provide a light-sensitive mixture which can be readily prepared as a chemically uniform product.

Additionally, it is an object of the present invention to provide a light-sensitive copying material exhibiting copying and printing properties comparable to the best naphthoquinone-diazide-sulfonate ester copying materials heretofore available.

Another object of the present invention is to provide a light-sensitive copying material with good oleophilic properties.

A further object of the present invention is to provide a light-sensitive copying material which exhibits a hard gradation.

These and other objects of the invention are achieved by providing a light-sensitive mixture comprising a naphthoquinone-diazide-sulfonate ester corresponding to the formula:

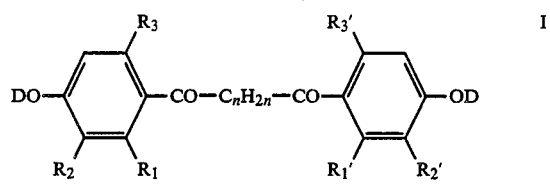

wherein

D represents a 1,2-naphthoquinone-2-diazide-5 sulfonyl radical or a 1,2-naphthoquinone-2-diazide-4-sulfonyl radical $R_1$, $R_2$, $R_3$, $R_1'$, $R_2'$, and $R_3'$ each represent hydrogen, halogen, alkyl having 1–4 carbon atoms or a radical of the formula DO, and n represents an integer from 2–18, preferably from 6–14, not more than 3 DO radicals being present on one benzene ring.

The objects of the invention are also achieved by providing a light-sensitive copying material comprising a support and a light-sensitive layer on said support, said light-sensitive layer comprising a naphthoquinone-diazide-sulfonate ester corresponding to the formula:

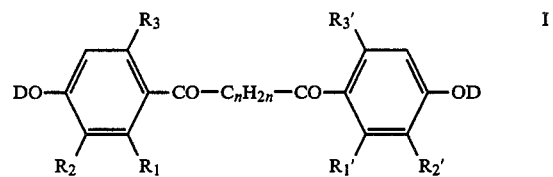

wherein

D represents a 1,2-naphthoquinone-2-diazide-5-sulfonyl radical or a 1,2-naphthoquinone-2-diazide-4-sulfonyl radical $R_1$, $R_2$, $R_3$, $R_1'$, $R_2'$, and $R_3'$ each represent hydrogen, halogen, alkyl having 1–4 carbon atoms or a radical of the formula DO, and n represents an integer from 2–18, preferably from 6–14, not more than 3 DO radicals being present on one benzene ring.

DETAILED DESCRIPTION OF PREFERRED EMBODIMENTS

The present invention relates to a light-sensitive mixture comprising a light-sensitive 1,2-naphthoquinone-2-diazide-4- or -5-sulfonic acid ester of a polyhydric phenol containing keto groups. The naphthoquinone-diazide-sulfonic acid ester in the mixture of the invention corresponds to the formula:

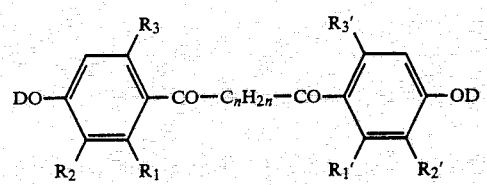

wherein D represents a 1,2-naphthoquinone-2-diazide-5-sulfonyl or -4-sulfonyl radical, preferably the -5-sulfonyl radical; $R_1$, $R_2$, $R_3$, $R_1{'}$, $R_2{'}$ and $R_3{'}$ represent hydrogen atoms or halogen atoms, alkyl groups having 1–4 carbon atoms or radicals of the formula DO, and n represents an integer from 2 to 18, preferably from 6 to 14, and wherein not more than a total of three DO radicals are present on one benzene ring.

The present invention also relates to a light-sensitive copying material comprising a support and a light-sensitive layer which contains a 1,2-naphthoquinone-2-diazide-sulfonic acid ester of a polyhydric phenol containing keto groups, said naphthoquinone-diazide-sulfonic acid ester corresponding to the above formula.

Amongst the compounds corresponding to the formula, the compounds in which at least two DO groups are present in each benzene ring are preferred. Resorcinol derivatives, i.e., compounds in which $R_1$ and $R_1{'}$ are DO radicals and $R_2$, $R_3$, $R_2{'}$ and $R_3{'}$ are hydrogen atoms, are particularly preferred.

The preferred alkyl substituents are methyl and ethyl groups, particularly methyl groups. The halogen atoms are preferably chlorine atoms or bromine atoms.

The quinone-diazides contained in the mixture of the invention are novel. They are prepared, analogously to known processes, by esterifying the phenolic hydroxyl groups with o-quinone-diazide-sulfonic acids or reactive derivatives thereof such as sulfonic acid chlorides.

The corresponding precursors, namely the diketophenols, may be obtained, for example, by reacting corresponding phenols with molten dicarboxylic acids at about 140° C. in the presence of anhydrous zinc chloride. The reaction time is from 2 to 5 hours. Some of the diketophenols listed in Table 1, prepared by the reaction of higher paraffin-dicarboxylic acids with resorcinol, have already been described by J. V. Braun, Anton and Meyer in *Chem. Berichte*, Vol. 74, p. 1772 (1941).

In some cases, the yield of diketophenol can be substantially increased if an excess of the phenol component (up to five times the stoichiometric amount) is employed. In place of zinc chloride, boron trifluoride can also be used advantageously for this reaction. For this purpose, the reaction melt at 80° to 120° C. is saturated with boron trifluoride for a period of 2 to 3 hours. The product is worked up by pouring the still fluid reaction mixture into ice water, with good stirring. The precipitated reaction product optionally may be treated with 0.1N sodium carbonate solution or ammonia solution. Any keto acids which may have formed and any uncoverted dicarboxylic acid are dissolved while the diketo compound is left.

Some diketophenols prepared from corresponding phenols and dicarboxylic acids are listed in the following table. The color of the diketophenols ranges from colorless to yellow. Column 3 gives the melting points obtained after recrystallization from the solvents indicated in brackets.

| Phenol component | Dicarboxylic acid | Melting point of diketophenol (°C.) |
|---|---|---|
| Resorcinol | Succinic acid | 305 (pyridine) |
| Resorcinol | Adipic acid | 285 (methanol) |
| Resorcinol | Suberic acid | 187 (water/acetone) |
| Phenol | Sebacic acid | 195 (ethanol) |
| Resorcinol | Sebacic acid | 167 (water/ethanol) |
| Pyrogallol | Sebacic acid | 184 (ethanol) |
| Resorcinol | 1,10-Decane-dicarboxylic acid | 152 (toluene) |
| Resorcinol | 1,12-Dodecane-dicarboxylic acid | 162 (toluene) |
| Resorcinol | 1,14-Tetradecane-dicarboxylic acid | 161 (glacial acetic acid) |
| Resorcinol | 1,16-Hexadecane-dicarboxylic acid | 139 (glacial acetic acid) |
| Resorcinol | 1,11-Undecane-dicarboxylic acid | 146 (glacial acetic acid) |
| Pyrogallol | Succinic acid | >300 (ethanol) |
| Phenol | Succinic acid | 191 (glacial acetic acid) |
| m-Cresol | Adipic acid | 123 (ethanol) |
| Resorcinol | Azelaic acid | 142 (ethanol) |
| Phloroglucinol | Sebacic acid | 270 (glacial acetic acid) |

The concentration of the novel naphthoquinone-diazide-sulfonic acid esters in the light-sensitive layer may vary within relatively wide limits. In general, the proportion of light-sensitive ester will be from 3 to 50 weight percent, preferably from 7 to 25 weight percent, relative to the solids content of the light-sensitive mixture.

Preferably, the light-sensitive mixtures of the invention also contain a polymeric, water-insoluble resinous binder which dissolves in the solvents used for the mixtures of the invention and is also soluble or at least swellable in aqueous alkalies.

The novolac condensation resins, which have proved suitable in many positive-copying materials based on naphthoquinone-diazides, have been found also to be particularly useful and advantageous ingredients in the mixtures of the invention containing the novel naphthoquinone-diazide-sulfonic acid esters. Such resins, particularly the more highly condensed resins in which substituted phenols such as cresols are condensed with formaldehyde, promote a sharp differentiation between the exposed and unexposed layer areas upon development. Other usable alkali-soluble or alkali-swellable binders include natural resins, such as shellac and colophony, and synthetic resins, such as copolymers of styrene and maleic anhydride or copolymers of acrylic acid or methacrylic acid, particularly with acrylate esters or methacrylate esters.

The nature and quantity of the alkali-soluble resin may vary depending on the intended use. Proportions of resin from 95 to 50 weight percent, particularly from 90 to 65 weight percent based on total solids content are preferred.

The alkali-soluble resin may be supplemented with numerous other resins, preferably epoxides and vinyl polymers such as polyvinyl acetates, polyacrylates, polyvinyl acetals, polyvinyl ethers, polyvinylpyrrolidones and copolymers of the monomers which form the foregoing homopolymers. The most advantageous proportion of supplemental resin depends on the technical requirements and on the effect of the resin on the development conditions. Generally, the proportion of supplemental resin is not more than 20 weight percent of the alkali-soluble resin. For special requirements, such as flexibility, adhesion, gloss, coloration, color change and the like, the light-sensitive mixture may also contain small quantities of substances such as polyglycols, cellulose derivatives such as ethylcellulose, wetting agents, dyes, adhesion-promoters, finely divided pigments, and also UV absorbers, if required.

To coat a suitable support, the mixtures are generally dissolved in a solvent. The selection of the solvent depends on the intended coating process, the layer thickness and the drying conditions. Suitable solvents for the mixtures of the invention include ketones such as methyl ethyl ketone, chlorinated hydrocarbons such as trichloroethylene and 1,1,1-trichloroethane, alcohols such as n-propanol, ethers such as tetrahydrofuran, alcohol-ethers such as ethylene glycol monoethyl ether, and esters such as butyl acetate. It is also possible to use mixtures, which for special purposes may additionally contain solvents such as acetonitrile, dioxane or dimethylformamide. In principle, any solvent which does not irreversibly react with the components of the layer may be used. Partial ethers of glycols, especially ethylene glycol monomethyl ether, are particularly preferred.

Metals are generally used as the supports for layers having thicknesses of less than about 10 $\mu$m. Offset printing plates may use bright-rolled mechanically or electrochemically roughened and optionally anodized aluminum which may also be pretreated chemically with, for example, polyvinylphosphonic acid, silicates, phosphates, hexafluorozirconates or with hydrolyzed tetraethyl orthosilicate, or multi-metal plates such as plates of Al/Cu/Cr or of brass/chromium as supports. For preparing letterpress plates, the mixtures of the invention may be applied to zinc or magnesium plates as well as to commercially available microcrystalline alloys thereof, for one-stage etching processes, or to etchable plastics such as polyoxymethylene. Because of their good adhesion and etch resistance on copper and nickel surfaces, the mixtures of the invention are suitable for gravure printing forms or screen-printing forms. Likewise, the mixtures of the invention can be used as photoresists in the manufacture of printed circuit boards and in chemical milling. In further applications, other supports, such as wood, paper, ceramics, textiles and other metals may be used.

Preferred supports for thick layers of more than 10 $\mu$m are synthetic polmer films which then serve as temporary supports for transfer layers. For this purpose, and for color-test films, polyester films such as polyethylene terephthalate films are preferred. However, polyolefin films such as polypropylene films are also suitable.

The coating of the support material may be carried out in a known manner by spin coating, spraying, dipping, roller application, extrusion through slot dies, blade application or casting. Finally, the coating of materials such as printed circuit boards, glass or ceramics and silicon wafers may also be effected by layer transfer from a temporary support. Exposure may be effected with the customary light sources in the art. Electron radiation or laser radiation may also possibly be used for image formation. The aqueous-alkaline solutions of graduated alkalinity, preferably having a pH in the range from 10 to 14, which are used for development and which may also contain minor amounts of organic solvents or wetting agents, remove those areas of the copying layer which have been exposed to light, and thus produce a positive image of the original.

The preferred uses of the light-sensitive mixtures of the invention are in the preparation of printing forms, particularly offset printing forms, autotype gravure printing forms and screen-printing forms, in photoresist solutions and in so-called dry resists.

Printing plates prepared with the new compounds exhibit a high practical light-sensitivity and an improved resistance to alkaline developers. The preferred compounds themselves are characterized by very good solubility in the customary solvents, by a good oleophilic character and alcohol resistance and by good compatibility with the other constituents of the copying layer.

The invention is explained in more detail with reference to the following non-limiting examples in which parts by weight and parts by volume are related as grams to $cm^3$. Unless otherwise stated, parts, proportions and percentages are expressed in terms of weight.

EXAMPLE 1

An electrolytically roughened and anodized aluminum plate having an oxide weight of 3.0 $g/m^2$ was coated with a solution of 1.10 parts esterification product obtained from 1 mole 1,10-bis-(2,4-dihydroxyphenyl)-decane-1,10-dione and 4 moles 1,2-naphthoquinone-2-diazide-5-sulfonic acid chloride, 5.70 parts cresol/formaldehyde novolac having a softening point of 105–120° C. according to DIN 53,181, 0.12 parts 4-(p-tolylmercapto)-2,5-diethoxybenzenediazonium hexafluorophosphate, 0.40 parts 2,3,4-trihydroxybenzophenone and 0.60 parts crystal violet in 40 parts ethylene glycol monomethyl ether and 50 parts tetrahydrofuran.

Before application of the light-sensitive copying layer, the anodized aluminum support had been treated with an aqueous solution of polyvinylphosphonic acid, as described in German Pat. No. 1,621,478.

The resulting pre-sensitized material, having a light-sensitive layer weight of 2.30 $g/m^2$, was exposed imagewise under a transparent positive original and then developed with the following solution:

5.3 parts sodium metasilicate $\times$ 9 $H_2O$, 3.4 parts trisodium phosphate $\times$ 12 $H_2O$ and 0.3 parts anhydrous sodium dihydrogen phosphate in 91.0 parts water.

The portions of the copying layer exposed to the light were removed by the development, and the unexposed image areas remained on the support. Approximately 200,000 perfect prints were obtained from the resulting printing form on an offset printing press. The printing stencil exhibited excellent oleophilic character, alcohol resistance and adhesion to the support.

Whereas the solubility of the above-described naphthoquinone-diazide-sulfonic acid ester in ethylene glycol monomethyl ether is 42% by weight at 23° C., it was only possible to produce a solution having a maximum concentration of 0.4% of the esterification product of 1 mole of 2,4-dihydroxyacetophenone and 2 moles of 1,2-naphthoquinone-2-diazide-5-sulfonic acid chloride in ethylene glycol monomethyl ether under the same experimental conditions.

Additional coating solutions are described in the following examples with which similar results were obtained. Unless specially noted, the preparation and processing of the printing plates prepared with these additional coating solutions correspond to the preparation and processing conditions described in Example 1.

EXAMPLE 2

An electrolytically roughened and anodized aluminum plate was coated with a solution of
1.10 parts esterification product obtained from 1 mole 1,14-bis-(2,4-dihydroxyphenyl)-tetradecane-1,14-dione and 4 moles 1,2-naphthoquinone-2-diazide-5-sulfonic acid chloride,
6.10 parts novolac described in Example 1,
0.14 parts 1,2-naphthoquinone-2-diazide-4-sulfonic acid chloride and
0.06 parts crystal violet in
30 parts ethylene glycol monomethyl ether,
40 parts tetrahydrofuran and
10 parts butyl acetate.

EXAMPLE 3

An electrolytically roughened and anodized aluminum plate, which had been subsequently treated with an aqueous solution of polyvinylphosphonic acid, was coated with a solution of
1.30 parts esterification product obtained from 1 mole 1,8-bis-(2,4-dihydroxyphenyl)-octane-1,8-dione and 4 moles 1,2-naphthoquinone-2-diazide-5-sulfonic acid chloride,
5.80 parts novolac described in Example 1,
0.18 parts 1,2-naphthoquinone-2-diazide-4-sulfonic acid chloride and
0.07 parts crystal violet in
30 parts ethylene glycol monomethyl ether,
40 parts tetrahydrofuran and
10 parts butyl acetate.

EXAMPLE 4

An electrolytically roughened and anodized aluminum plate, which had been subsequently treated with an aqueous solution of polyvinylphosphonic acid, was coated with a solution of
1.10 parts esterification product obtained from 1 mole 1,10-bis-(2,3,4-trihydroxyphenyl)-decane-1,10-dione and 6 moles 1,2-naphthoquinone-2-diazide-5-sulfonic acid chloride,
5.70 parts novolac described in Example 1,
0.12 parts 4-(p-tolylmercapto)-2,5-diethoxybenzenediazonium hexafluorophosphate,
0.40 parts 2,3,4-trihydroxybenzophenone and
0.06 parts crystal violet in
40 parts ethylene glycol monomethyl ether and
50 parts tetrahydrofuran.

EXAMPLE 5

An aluminum foil which had been mechanically roughened with a steel wire brush was coated with a solution of
1.00 parts esterification product obtained from 1 mole 1,12-bis-(2,4-dihydroxyphenyl)-dodecane-1,12-dione and 4 moles 1,2-naphthoquinone-2-diazide-5-sulfonic acid chloride,
6.40 parts novolac described in Example 1,
0.20 parts polyvinyl acetal containing about 70% of vinyl acetal units, 24–27% of vinyl alcohol units and 1% of vinyl acetate units,
0.12 parts 1,2-naphthoquinone-2-diazide-4-sulfonic acid chloride and
0.06 parts crystal violet in
30 parts ethylene glycol monomethyl ether,
40 parts tetrahydrofuran and
10 parts butyl acetate.

EXAMPLE 6

An electrolytically roughened and anodized aluminum plate having an oxide weight of 3.0 g/m$^2$ was coated with a solution of
1.20 parts esterification product obtained from 1 mole 1,10-bis-(2,4-dihydroxyphenyl)-decane-1,10-dione and 4 moles 1,2-naphthoquinone-2-diazide-4-sulfonic acid chloride,
6.30 parts novolac described in Example 1,
0.12 parts 4-(p-tolylmercapto)-2,5-diethoxybenzenediazonium hexafluorophosphate and
0.06 parts crystal violet in
40 parts ethylene glycol monomethyl ether and 50 parts tetrahydrofuran.

EXAMPLE 7

An electrolytically roughened and anodized aluminum plate having an oxide weight of 2.0 g/m$^2$ was coated with a solution of
1.20 parts esterification product obtained from 1 mole 1,10-bis-(4-hydroxyphenyl)-decane-1,10-dione and 2 moles 1,2-naphthoquinone-2-diazide-5-sulfonic acid chloride,
6.00 parts novolac described in Example 1,
0.10 parts 1,2-naphthoquinone-2-diazide-4-sulfonic acid chloride,
0.20 parts 2,3,4-trihydroxybenzophenone and
0.06 parts crystal violet in
35 parts ethylene glycol monomethyl ether,
45 parts tetrahydrofuran and
10 parts butyl acetate.

EXAMPLE 8

An electrolytically roughened and anodized aluminum plate, which had been subsequently treated with an aqueous solution of polyvinylphosphonic acid, was coated with a solution of
1.00 part esterification product obtained from 1 mole 1,4-bis-(2,4-dihydroxyphenyl)-butane-1,4-dione and 4 moles 1,2-naphthoquinone-2-diazide-5-sulfonic acid chloride,
6.30 parts novolac described in Example 1,
0.11 parts 4-(p-tolylmercapto)-2,5-diethoxybenzenediazonium hexafluorophosphate and
0.06 parts crystal violet in
40 parts ethylene glycol monomethyl ether and
50 parts tetrahydrofuran.

EXAMPLE 9

This example describes a copying layer solution which can be used as a positive photoresist composition for various purposes, particularly for preparing etching stencils as used, for example, in the chemical milling of parts and labels and in the preparation of printed circuit images, particularly for microelectronics. The solution had good stability. It was possible to match the type of coating and the layer thickness to the particular requirements within wide limits. After exposure, the exposed areas stood out with good contrast from the unexposed areas. The exposed areas could readily be removed by means of an alkaline developer (pH about 12.8).

A solution was prepared from:
1.5 parts esterification product obtained from 1 mole 1,10-bis-(2,4-dihydroxyphenyl)-decane-1,10-dione and 4 moles 1,2-naphthoquinone-2-diazide-5-sulfonic acid chloride,
0.4 parts 4-(p-tolylmercapto)-2,5-diethoxybenzenediazonium hexafluorophosphate,
0.1 parts crystal violet (C.I. 42,555),
10.0 parts novolac described in Example 1 and
2.0 parts epoxy resin having an epoxy equivalent weight of 450–500 and a melting range of 64°–74° C. in
40 parts by volume ethylene glycol monomethyl ether,
50 parts by volume tetrahydrofuran and
10 parts by volume butyl acetate.
A plate of insulating material laminated to a 35 μm thick copper foil, was coated with the solution.

EXAMPLE 10

A biaxially stretched and thermofixed polyethylene terephthalate film was coated with a solution of
1.20 parts esterification product obtained from 1 mole of 1,10-bis-(2,4-dihydroxyphenyl)-decane-1,10-dione and 4 moles of 1,2-naphthoquinone-2-diazide-5-sulfonic acid chloride,
5.60 parts novolac described in Example 1,
0.12 parts 4-(p-tolylmercapto)-2,5-diethoxybenzenediazonium hexafluorophosphate,
0.20 parts 2,3,4-trihydroxybenzophenone and
1.00 part crystal violet in
40 parts tetrahydrofuran,
10 parts butyl acetate, and
40 parts ethylene glycol monomethyl ether.
The resulting color film was used for preparing make-up copies and register copies for mounting films and for mounting checks. Exposure and development were carried out as described in Example 1.

The foregoing preferred embodiments have been described merely to illustrate the invention and are not intended to be limiting. Since modifications of the disclosed embodiments incorporating the spirit and substance of the invention may occur to persons skilled in the art, the scope of the invention is to be limited solely with respect to the appended claims and equivalents.

I claim:

1. A light-sensitive copying material comprising a support and a light-sensitive layer containing a 1,2-naphthoquinone-2-diazide-sulfonic acid ester of a polyhydric phenol containing keto groups corresponding to the formula:

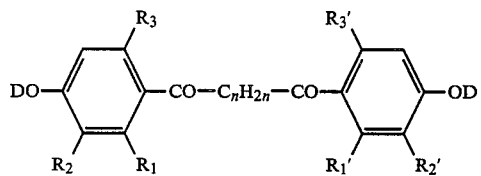

wherein
D represents a 1,2-naphthoquinone-2-diazide-5-sulfonyl or a 1,2-naphthoquinone-2-diazide-4-sulfonyl radical,
$R_1$, $R_2$, $R_3$, $R_1'$, $R_2'$ and $R_3'$ each represent hydrogen, halogen, alkyl groups having a 1 to 4 carbon atoms or radicals of the formula DO,
n represents an integer from 2 to 18,
and not more than three DO radicals are present on one benzene ring.

2. A light-sensitive copying material according to claim 1, wherein said support comprises an aluminum sheet.

3. A light-sensitive copying material according to claim 2, wherein said aluminum sheet is electrolytically roughened and anodized prior to application of the light-sensitive layer.

4. A light sensitive mxiture comprising a light-sensitive 1,2-naphthoquinone-2-diazide-sulfonic acid ester of a polyhydric phenol containing keto groups corresponding to the general formula:

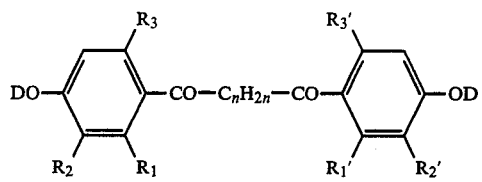

wherein
D represent a 1,2-naphthoquinone-2-diazide-5-sulfonyl or a 1,2-naphthoquinone-2-diazide-4-sulfonyl radical,
$R_1$, $R_2$, $R_3$, $R_1'$, $R_2'$, and $R_3'$ each represent hydrogen, halogen, or alkyl groups having 1 to 4 carbon atoms or radicals of the formula DO,
n represents an integer from 2 to 18,
and not more than three DO radicals are present on one benzene ring, and
a water-insoluble binder which is soluble or swellable in aqueous-alkaline solutions.

5. A light-sensitive mixture according to claim 4, wherein said naphthoquinone-diazide-sulfonic acid ester comprises from 3 to 50 weight percent of the solids content of said mixture.

6. A light-sensitive mixture according to claim 5, wherein said naphthoquinone-diazide-sulfonic acid ester comprises from 7 to 25 weight percent of the solids content of said mixture.

7. A light-sensitive compound comprising a light-sensitive 1,2-naphthoquinone-2-diazide-sulfonic acid ester of a polyhydric phenol containing keto groups corresponding to the general formula:

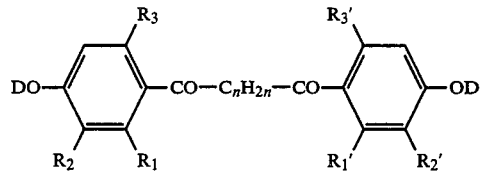

wherein
D represents a 1,2-naphthoquinone-2-diazide-5-sulfonyl or a 1,2-naphthoquinone-2-diazide-4-sulfonyl radical,
$R_1$, $R_2$, $R_3$, $R_1'$, $R_2'$ and $R_3'$ each represent hydrogen, halogen, alkyl groups having 1 to 4 carbon atoms or radicals of the formula DO,
n represents an integer from 2 to 18,
and not more than three DO radicals are present on one benzene ring.

8. A light-sensitive compound according to claim 7, wherein at least one of $R_1$, $R_2$ and $R_3$ and at least one of $R_1'$, $R_2'$ and $R_3'$ represent DO radicals.

9. A light-sensitive compound according to claim 8, wherein $R_1$ and $R_1'$ represent DO radicals and $R_2$, $R_3$, $R_2'$ and $R_3'$ represent hydrogen.

10. A light-sensitive compound according to claim 7, wherein n represents an integer from 6 to 14.

* * * * *